United States Patent
Hsu et al.

(10) Patent No.: US 7,212,045 B2
(45) Date of Patent: May 1, 2007

(54) DOUBLE FREQUENCY SIGNAL GENERATOR

(75) Inventors: Cheng-Chia Hsu, Chupei (TW); Teng-Ho Wu, Yongkang (TW); Yu-Cheng Pan, Houlong Township, Miaoli County (TW); Ho-Wen Chen, Rueifang Township, Taipei County (TW)

(73) Assignee: Logan Technology Corp., Hsinchu (TW)

( * ) Notice: Subject to any disclaimer, the term of this patent is extended or adjusted under 35 U.S.C. 154(b) by 151 days.

(21) Appl. No.: 11/187,874

(22) Filed: Jul. 25, 2005

(65) Prior Publication Data

US 2007/0018697 A1    Jan. 25, 2007

(51) Int. Cl.
*H03B 19/00* (2006.01)
(52) U.S. Cl. .................. 327/116; 327/119; 327/131; 327/134; 327/135; 327/136; 327/172; 327/175
(58) Field of Classification Search ............... 327/116, 327/112, 113, 131, 134, 135, 136, 172, 175
See application file for complete search history.

(56) References Cited

U.S. PATENT DOCUMENTS

| | | | | |
|---|---|---|---|---|
| 5,359,232 A | * | 10/1994 | Eitrheim et al. | 327/116 |
| 5,475,322 A | * | 12/1995 | MacDonald | 326/93 |
| 5,777,500 A | * | 7/1998 | Eitrheim | 327/174 |
| 5,914,996 A | * | 6/1999 | Huang | 377/39 |
| 5,963,071 A | * | 10/1999 | Dowlatabadi | 327/175 |
| 6,707,264 B2 | * | 3/2004 | Lin et al. | 315/307 |
| 6,834,255 B2 | * | 12/2004 | Abrosimov et al. | 702/181 |
| 2003/0071586 A1 | * | 4/2003 | Lin et al. | 315/291 |

* cited by examiner

*Primary Examiner*—Timothy P Callahan
*Assistant Examiner*—Hiep Nguyen

(57) ABSTRACT

A double frequency signal generator to which a synchronization signal having a duty cycle of 1% to 999% is inputted. The synchronization signal is used for triggering of a switching component at positive and negative edges to generate a triangular-wave signal. An average of voltages of the triangular-wave signal is acquired and compared with the triangular-wave signal at a comparator to generate a square-wave having a duty cycle of 50%. Then, the square-wave signal is used for triggering at positive and negative edges to generate a double frequency signal. As such, the high cost issue and the limitation of a square-wave input signal occurred in the prior art may be efficiently overcome.

1 Claim, 3 Drawing Sheets

DOUBLE FREQUENCY SIGNAL GENERATOR

BACKGROUND OF THE INVENTION

1. Field of the Invention

The present invention is related to a double frequency signal generator. More particularly, the present invention is related to a double frequency signal generator in which a double frequency signal may be provided with presence of a synchronization signal having a duty cycle of 1% to 99% as an inputted signal.

2. Description of the Related Art

A conventional integrated chip (IC)-based double frequency signal generator is shown in FIG. 1. The double frequency signal generator 1 is composed of an IC and several electronic components. Through the IC-based double frequency signal generator 1, an input signal is conversed to an output signal having a frequency double that of the input signal. However, since the IC-based double frequency signal generator 1 involves the IC, a cost burden is generally taken place when a plenty of such double frequency signal generators are required.

To resolve the high cost issue of the above IC-based double frequency circuit, an analog double frequency circuit has been suggested. Referring to FIG. 2, a schematic diagram of a conventional analog double frequency circuit 2 is shown therein. In the analog double frequency circuit 2, a square-wave signal having a duty cycle of 50% is inputted. Then, the square-wave signal is use for triggering at positive and negative edges and thus a double frequency signal is generated. However, the input signal has to be strictly limited to a square-wave signal having a duty cycle of 50%. If any error takes place on the input signal, the generated signal may not be an exact double frequency signal. Thus, this kind of double frequency generator is not significantly ideal and practicable.

From the above discussion, it can be readily known that such conventional double frequency signal generator is inherent with some drawbacks and needs to be addressed and improved.

In view of these problems encountered in the prior art, the Inventors have paid many efforts in the related research and finally developed successfully a double frequency signal generator, which is taken as the present invention.

SUMMARY OF THE INVENTION

Therefore, the present invention is to provide a double frequency signal generator, through which the high cost issue and the limitation of a square-wave input signal occurred in convention may be efficiently resolved.

In the double frequency signal generator according to the present invention, a synchronization signal having a duty cycle of 1% to 99% is inputted. The synchronization signal is used for triggering of a switching component at positive and negative edges to generate a triangular-wave signal. An average of voltages of the triangular-wave signal is acquired and compared with the triangular-wave signal at a comparator to generate a square-wave having a duty cycle of 50%. Then, the square-wave signal is used for triggering at positive and negative edges to generate a double frequency signal.

BRIEF DESCRIPTION OF THE DRAWINGS

The drawings disclose an illustrative embodiment of the present invention which serves to exemplify the various advantages and objects hereof, and are as follows.

DETAILED DESCRIPTION OF THE PREFERRED EMBODIMENT

Figure 1:
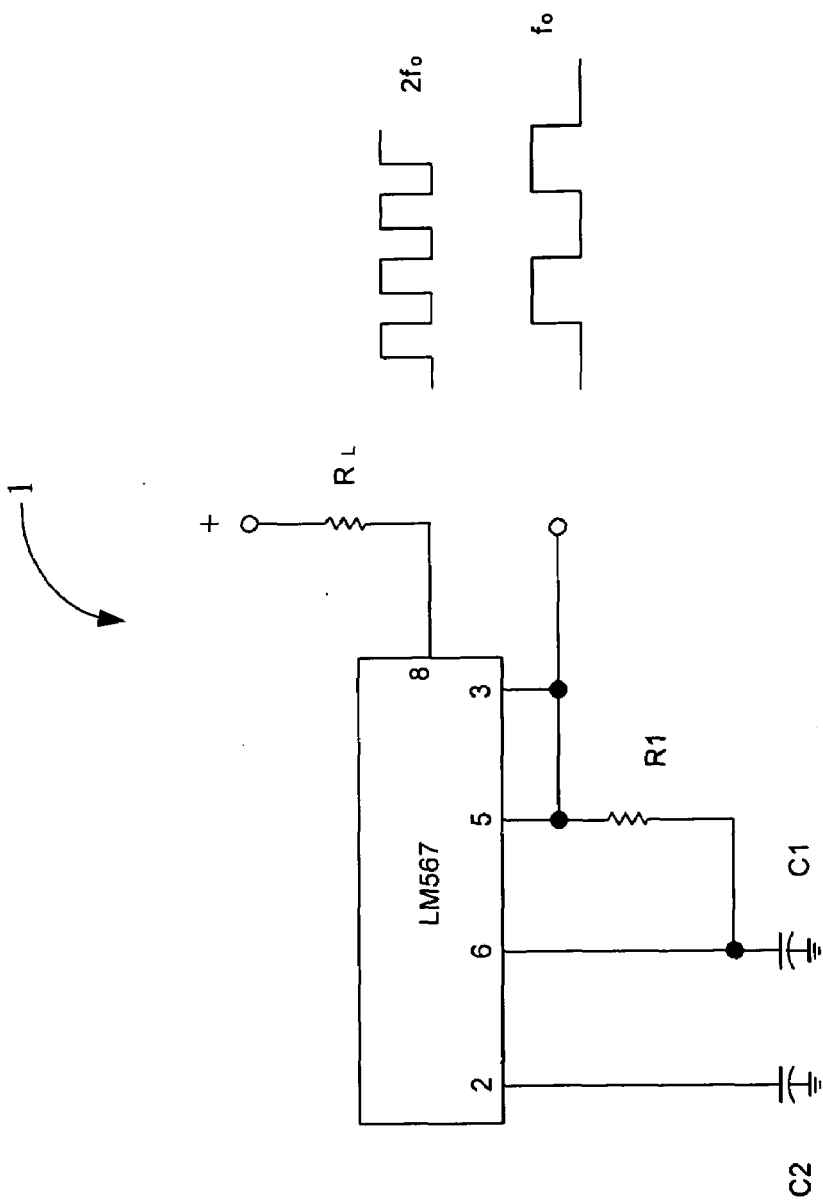
FIG. 1 is a schematic diagram of a circuit of a conventional IC-based double frequency signal generator.
Figure 2:
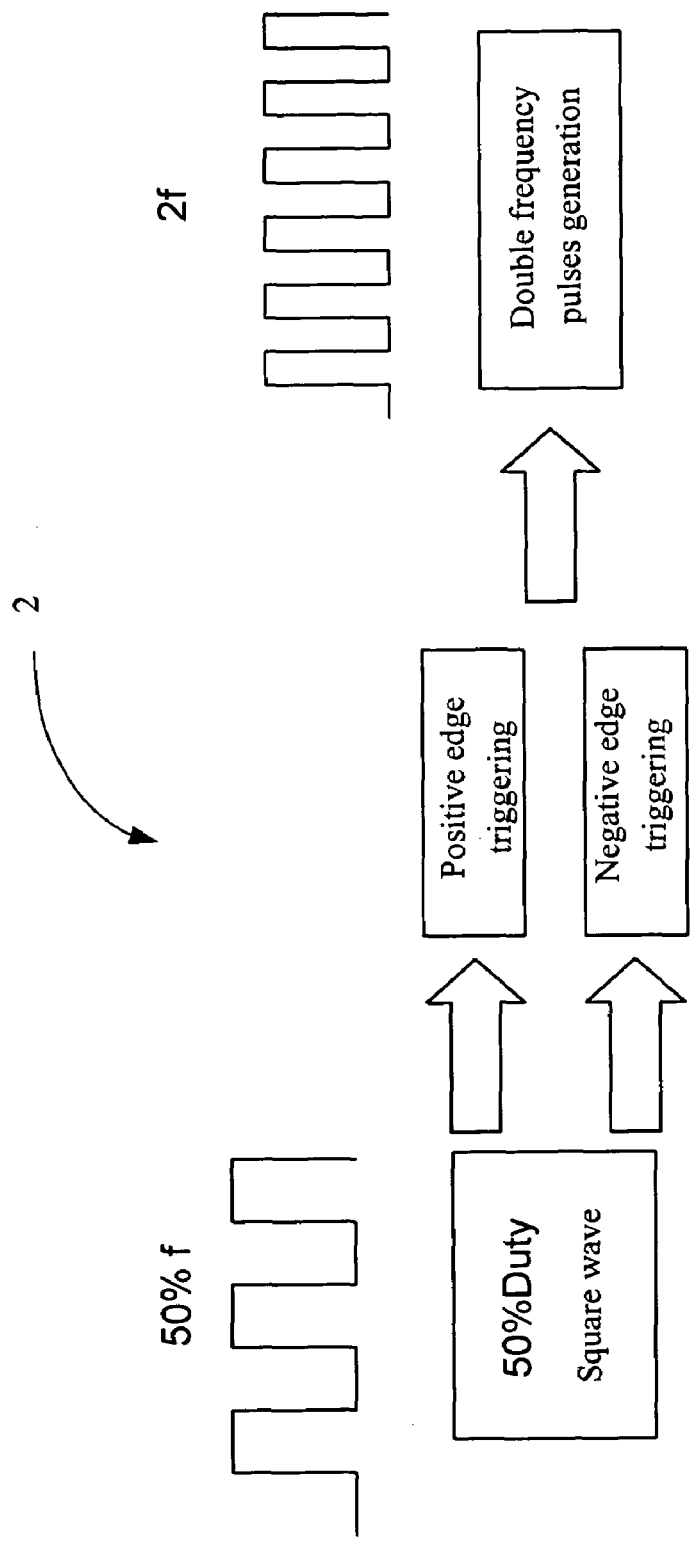
FIG. 2 is a block diagram of a conventional analog double frequency signal generator.
Figure 3:
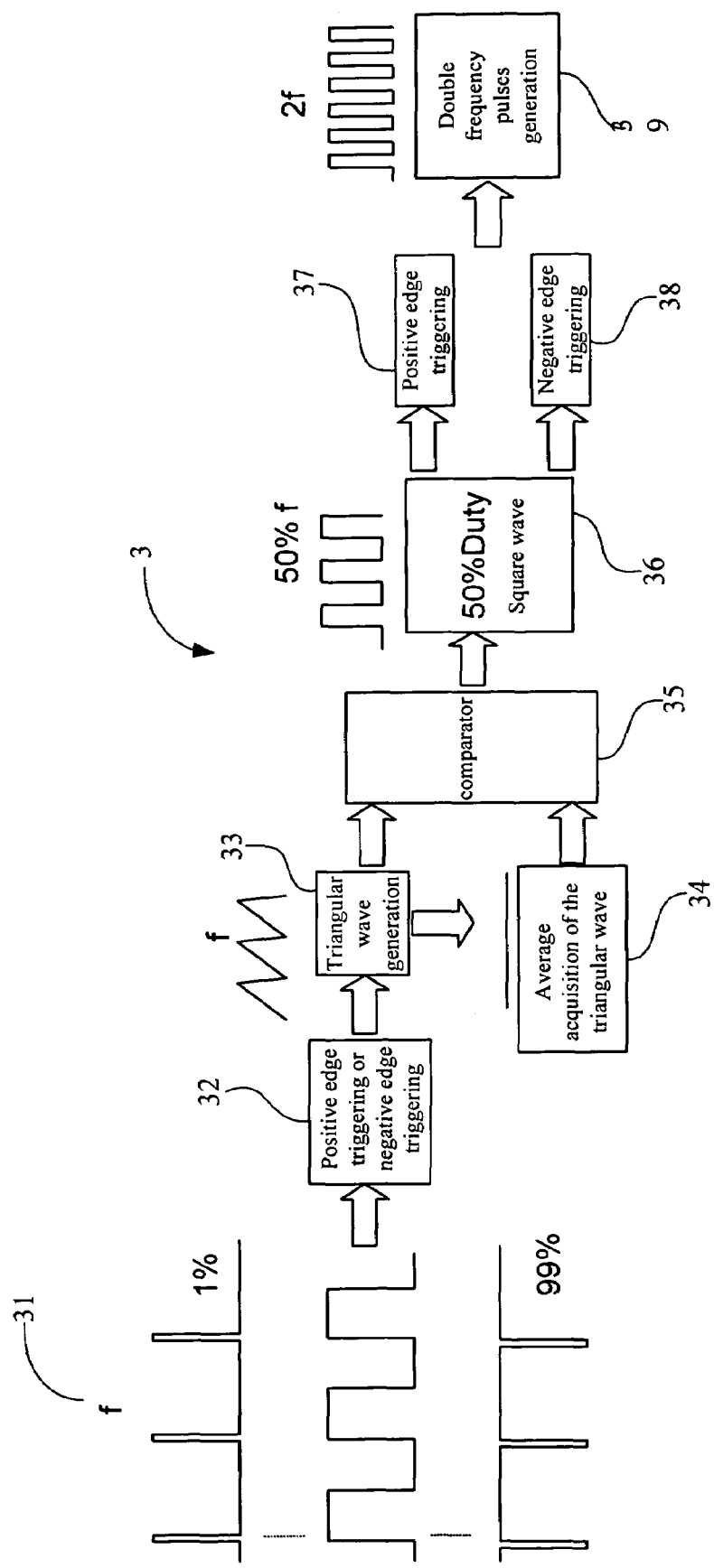
FIG. 3 is a block diagram of a double frequency signal generator according to the present invention.

Referring to FIG. 3, a block diagram of a double frequency signal generator according to the present invention is shown therein. As shown, a synchronization signal 31 having a duty cycle of 1% to 99% is inputted into the double frequency signal generator 3. The synchronization signal 31 is used for triggering of a switching component at positive and negative edges to generate a triangular-wave signal at block 33. Then, an average of voltages of the triangular-wave signal is acquired at block 34 and compared with the triangular-wave signal at a comparator 35 to generate a square-wave having a duty cycle of 50% at block 36. Then, the square-wave signal is used for triggering at positive and negative edges 37,38 to generate a double frequency signal 39.

As compared to the conventional techniques, the double frequency signal generator of this invention further provides the following advantages. 1. The high cost issue of the conventional IC-based double frequency signal generator is efficiently overcome. 2. The synchronization signal inputted to the double frequency signal generator may have a duty cycle from 1% to 999%, eliminating the limitation of 50% of the square-wave signal in the conventional analog double frequency signal generator. 3. The double frequency signal generator also has the advantages of lower cost, wide applicable range, superior industrial applicability and prolonged lifetime.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A double frequency signal generator to which a synchronization signal having a duty cycle of 1% to 99% is inputted, the synchronization signal being used for triggering of a switching component at positive and negative edges to generate a triangular-wave signal, an average of voltages of the triangular-wave signal being acquired and compared with the triangular-wave signal at a comparator to generate a square-wave having a duty cycle of 50%, the square-wave signal being used for triggering at positive and negative edges to generate a double frequency signal.

* * * * *

UNITED STATES PATENT AND TRADEMARK OFFICE
CERTIFICATE OF CORRECTION

PATENT NO. : 7,212,045 B2  Page 1 of 1
APPLICATION NO. : 11/187874
DATED : May 1, 2007
INVENTOR(S) : Cheng-Chia Hsu It is certified that error appears in the above-identified patent and that said Letters Patent is hereby corrected as shown below:

On the Title Page Item (73)
The assignee should be --Logah Technology Corp.-- instead of "Logan Technology Corp.".

Signed and Sealed this

Second Day of December, 2008

JON W. DUDAS
*Director of the United States Patent and Trademark Office*